(12) United States Patent
Van Gaal

(10) Patent No.: US 6,833,991 B2
(45) Date of Patent: Dec. 21, 2004

(54) PASSIVE COOLING APPARATUS FOR AN OUTDOOR CABINET

(75) Inventor: Adrianus Van Gaal, Kanata (CA)

(73) Assignee: Catena Networks, Inc., Redwood Shores, CA (US)

(*) Notice: Subject to any disclaimer, the term of this patent is extended or adjusted under 35 U.S.C. 154(b) by 0 days.

(21) Appl. No.: 10/293,218

(22) Filed: Nov. 12, 2002

(65) Prior Publication Data
US 2003/0107873 A1 Jun. 12, 2003

(30) Foreign Application Priority Data
Nov. 14, 2001 (CA) .............................................. 2361970

(51) Int. Cl.[7] .............................................. H05K 7/20
(52) U.S. Cl. ........................ 361/690; 361/688; 361/689; 361/707; 165/80.3; 165/185; 174/16.1; 454/184
(58) Field of Search ................................. 361/689–695, 361/703, 704, 724; 174/16.1, 16.3; 165/80.3, 185; 454/184

(56) References Cited

U.S. PATENT DOCUMENTS

| | | | |
|---|---|---|---|
| 3,900,700 A | 8/1975 | Gaudet | |
| 4,535,386 A | 8/1985 | Frey et al. | |
| 4,742,864 A | 5/1988 | Duell et al. | |
| 4,840,225 A | * 6/1989 | Foley et al. | ............ 165/104.33 |
| 4,858,069 A | * 8/1989 | Hughes | ...................... 361/696 |
| 6,088,225 A | 7/2000 | Parry et al. | |
| 6,385,046 B1 | 5/2002 | Ta et al. | |
| 2002/0122299 A1 | * 9/2002 | Kelly et al. | .................. 361/704 |

FOREIGN PATENT DOCUMENTS

JP          63302598 A   * 12/1988    ............ H05K/7/20

* cited by examiner

Primary Examiner—Boris Chérvinsky
(74) Attorney, Agent, or Firm—Potomac Patent Group, PLLC

(57) ABSTRACT

A cooling apparatus attaches to a cabinet housing electronics for protecting the electronics from external elements. The cooling apparatus includes an exterior surface for exposure to the external elements and a coupling that attaches the exterior surface to the cabinet. When the cooling apparatus is attached to a surface of the cabinet, the exterior surface is maintained in a spaced-apart relationship from the cabinet, forming an enclosed channel having a pair of openings, one of the openings being located above the other. In such a manner, the cooling apparatus can be added to cool an existing, installed, in-place cabinet without requiring extensive modification to the existing cabinet.

5 Claims, 3 Drawing Sheets

PASSIVE COOLING APPARATUS FOR AN OUTDOOR CABINET

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention relates generally to the field of cabinets for outdoor use for enclosing electronic equipment. More specifically, the invention relates to a passive cooling apparatus for a cabinet that shields the cabinet from solar radiation and extracts heat generated by internal electronic equipment by convection.

Outdoor cabinets are often used to house communications equipment such as racks of cards holding electronic or optical components. Such cabinets are provided at outdoor locations where there is no suitable existing building to hold the equipment and protect it from adverse environmental conditions and where the size of the equipment may be too small to justify a dedicated building. Examples of such cabinets include roadside cabinets for housing electronics for controlling traffic signals or cabinets for telecommunications equipment such as digital loop carrier cards and cellular radio base stations.

Considerations in the design of such cabinets include: thermal management, level of environmental protection, corrosion resistance, strength-to-cost ratio, public safety, aesthetic considerations, vulnerability to vandalism, ease of installation, ease of access to equipment, and level of electromagnetic shielding. There are two main aspects with respect to thermal management: equipment inside the cabinet generates heat which may need to be extracted, and the cabinet may be subject to external sources of heat such as solar radiation.

To avoid deterioration from contaminants and corrosives in the ambient air, cabinets are often designed to prevent ambient air from passing over electronic equipment. Typically, electronic equipment is sealed within the cabinet and fans or a heat exchanger may be used to provide cooling where required. In some cases, the cabinet may be air-conditioned.

Several techniques for the cooling of outdoor electronic equipment cabinets are known. For example, it is known from U.S. Pat. No. 6,088,225 to Parry, et al. and U.S. Pat. No. 3,900,700 to Gaudet to provide a double skin or shield for the sides of an enclosure, which assists in cooling the equipment by the "chimney" effect. A chimney effect is produced in the cavity between the skins. An inlet at the bottom of the cavity allows air in, to flow up the cavity, and out of an outlet at the top of the cavity. Heat from the internal skin is thus extracted from the cabinet by convection and thus the equipment inside the cabinet can be kept cool. Furthermore, heat from solar radiation on the external skin can also be extracted and prevented from reaching the equipment inside.

One disadvantage of these known techniques is that the passive cooling element is incorporated within the structure of the cabinet itself. Hence, positioning of the cabinet may be constrained if full advantage of the passive cooling element is to be achieved. Furthermore, being incorporated within the structure of these known cabinets, the passive cooling elements cannot be readily applied to cabinets having different structures. Furthermore, since the passive cooling element is incorporated within the structure of the cabinet itself, it is expensive to retrofit existing cabinets.

A need therefore exists for an apparatus that will allow for the effective and flexible application of passive cooling techniques to outdoor cabinets of varying structure. Consequently, it is an object of the present invention to obviate or mitigate at least some of the above-mentioned disadvantages.

BRIEF SUMMARY OF THE INVENTION

In accordance with an aspect of the present invention, there is provided a cooling apparatus for attaching to a cabinet housing electronics for protecting electronics from external elements. The cooling apparatus comprises an exterior surface for exposing to the external elements and a coupling for attaching the exterior surface to the cabinet. When the cooling apparatus is attached to a surface of the cabinet, the exterior surface is maintained in a spaced-apart relationship from the cabinet forming an enclosed channel having a pair of openings, one of the openings being located above the other.

It is an advantage of the present invention that this heat removal can be achieved passively without the need for a fan blowing external air across the surface of an air-to-air heat exchanger. The apparatus of the invention uses a heat exchanger surface but rather than utilizing a fan for cooling, it employs natural convection airflow generated by a chimney effect. This chimney effect is achieved by allowing air to enter the bottom and exit from the top of a vertical duct, which is formed by the attachment of a vertical channel to an outer vertical surface of the outdoor cabinet. While this vertical channel provides the advantage of creating additional heat transfer surfaces, its primary purpose is to facilitate the chimney effect in order to enhance the natural convection airflow.

BRIEF DESCRIPTION OF THE DRAWINGS

The invention may best be understood by referring to the following description and accompanying drawings which illustrate an embodiment of the invention. In the drawings.

DETAILED DESCRIPTION OF THE INVENTION

Figure 1:
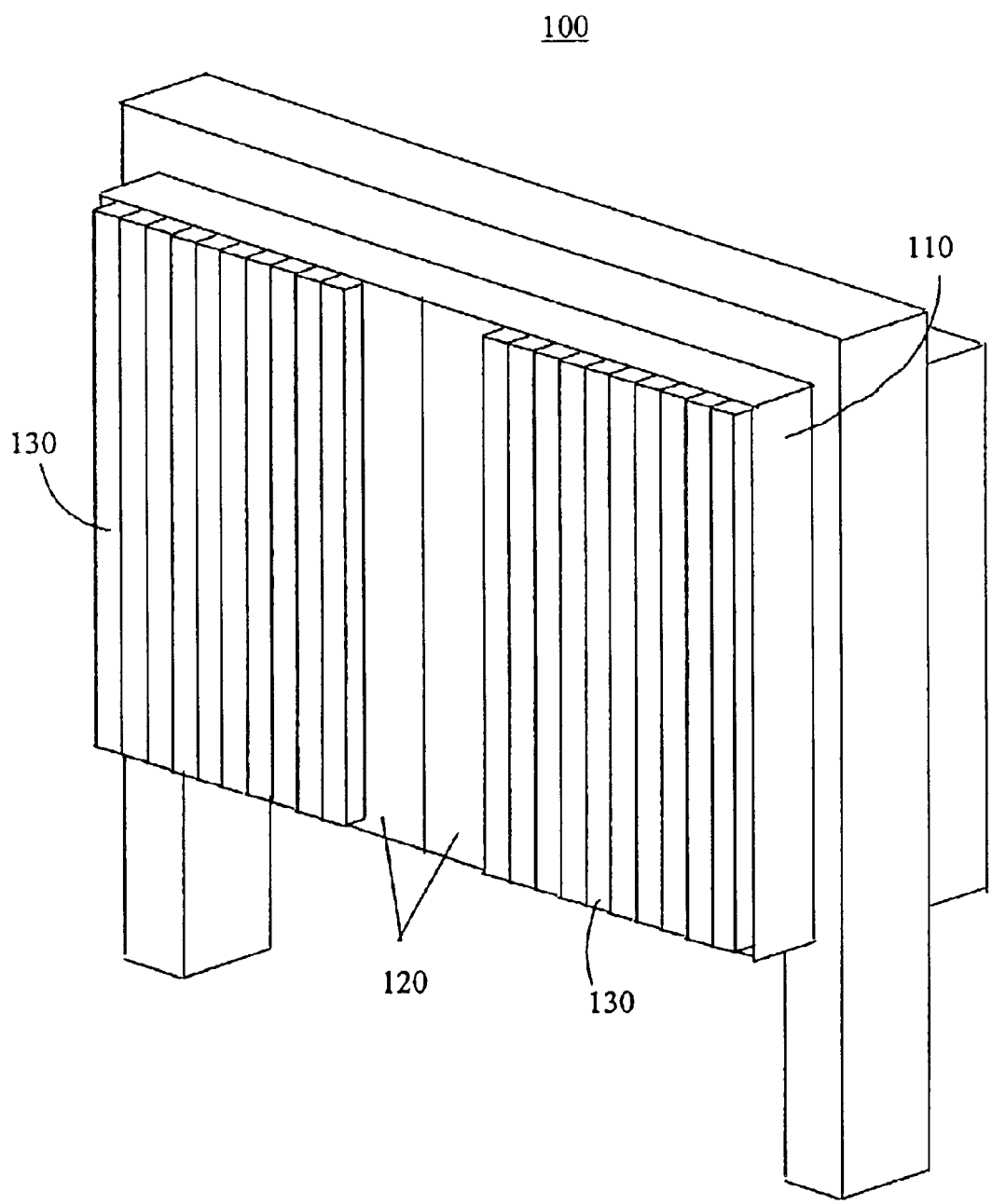
FIG. 1 is a perspective view illustrating a passive cooling apparatus mounted on an outdoor cabinet housing electronic equipment.

In the following description, numerous specific details are set forth to provide a thorough understanding of the invention. However, it is understood that the invention may be practiced without these specific details. In other instances, well-known structures and techniques have not been described or shown in detail in order not to obscure the invention. In the drawings, like numerals refer to like structures.

A passive cooling apparatus is applied to outdoor cabinets where the cabinet is sealed to protect internal electronics from wind-driven rain, insects, and/or dirt. Typical examples include digital loop carrier cabinets or cellular equipment cabinets. For example, the passive cooling apparatus may be installed on the doors of Lucent Technologies' 80 Series of Outside Plant Cabinets. According to one embodiment, the passive cooling apparatus is installed on both sides of the cabinet. The main benefit in thermal performance is derived from the solar-loaded side of the cabinet. In addition to upgrading the thermal performance of existing cabinets in the field, the passive cooling apparatus may be added to newly manufactured cabinets prior to field deployment.

Figure 2:
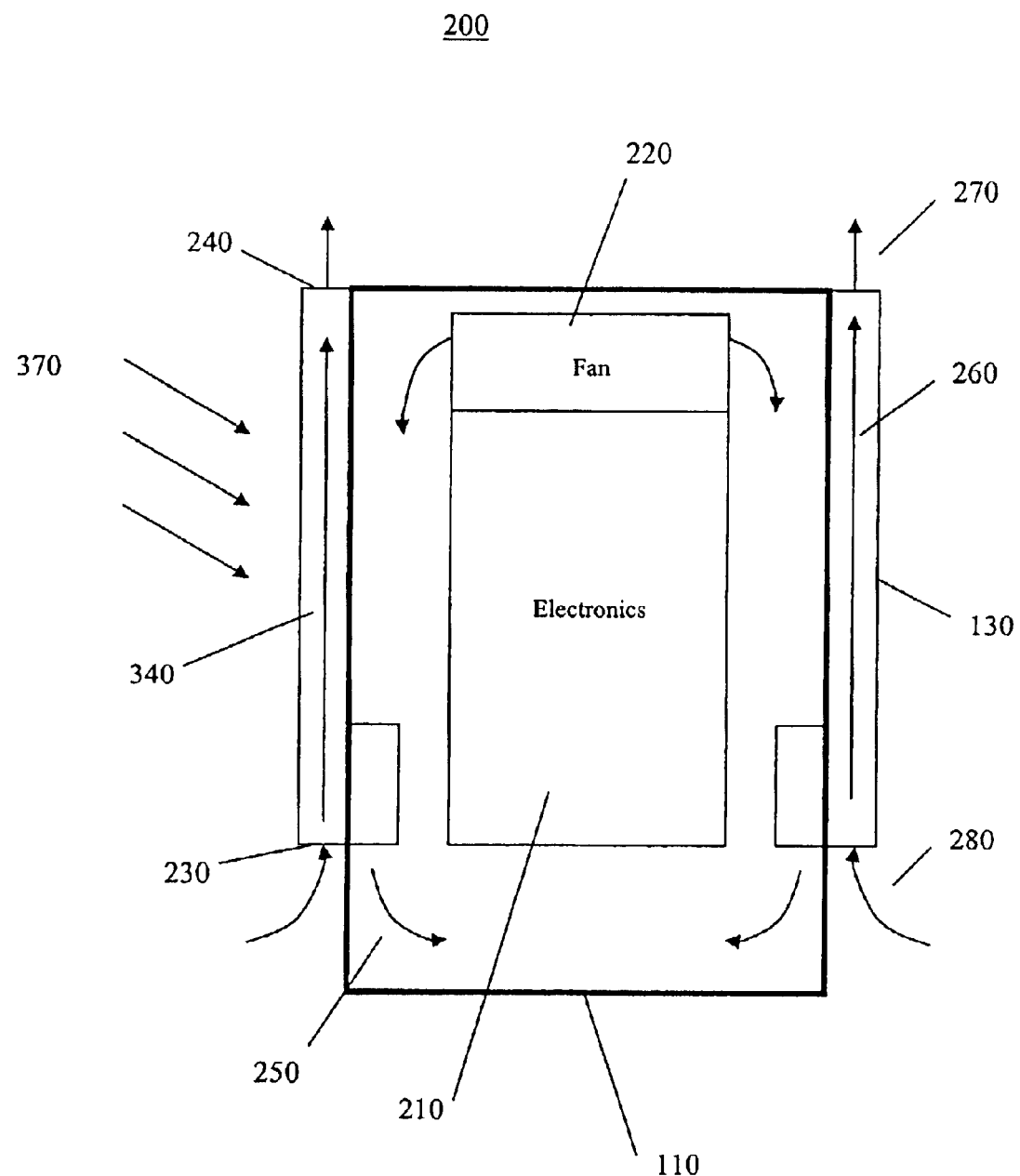
FIG. 2 is a section view of the passive cooling apparatus illustrated in FIG. 1.
Figure 3:
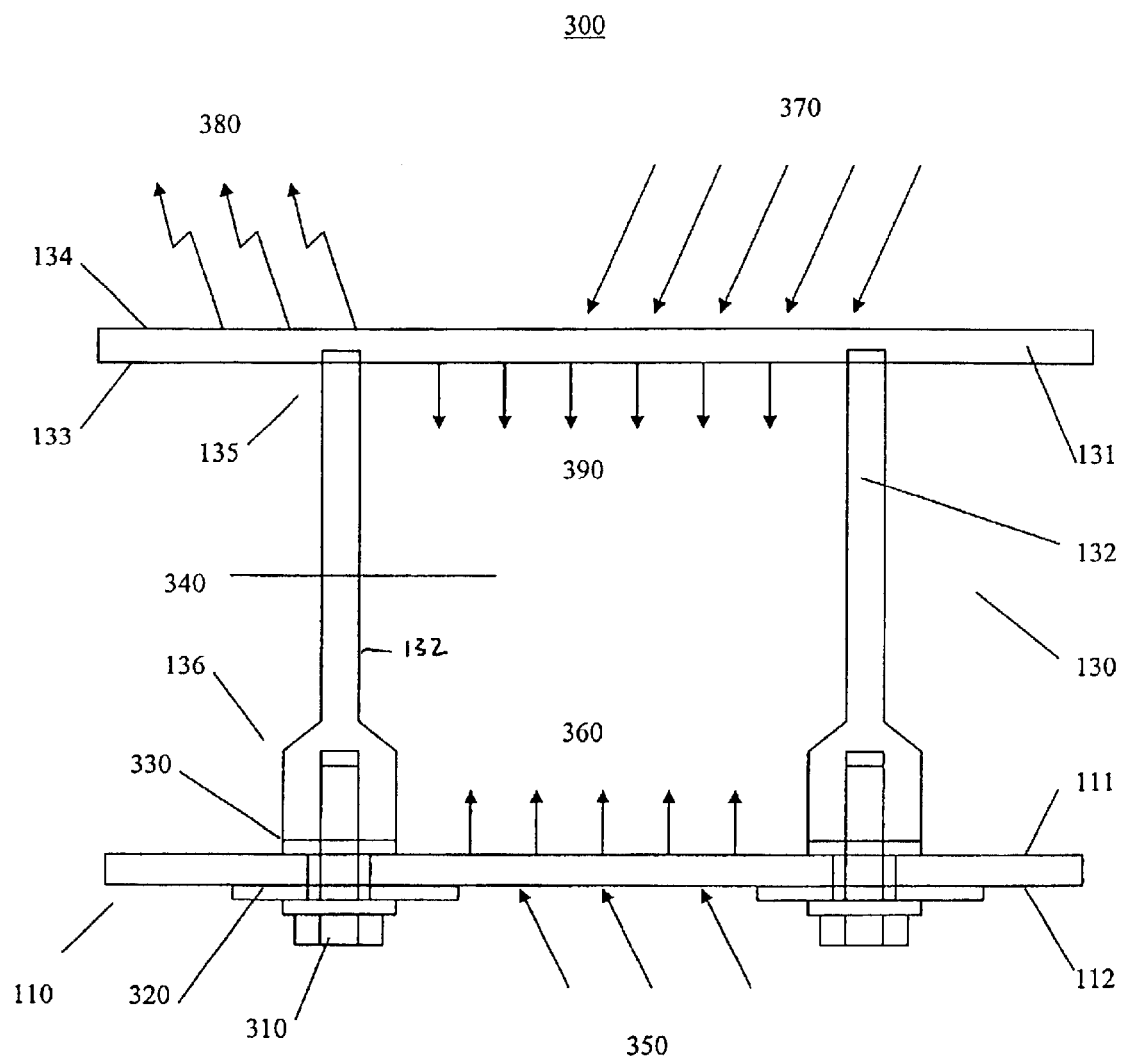
FIG. 3 is a partial top section view of the passive cooling apparatus illustrated in FIG. 1.

Referring to FIG. 1, there is shown a perspective view of a mounted passive cooling apparatus, illustrated generally by numeral 100. A passive cooling apparatus 130 is mounted on doors 120 of an outdoor electronic equipment cabinet 110. The passive cooling apparatus 130 can be mounted on any essentially vertical surface of the cabinet 110. Referring to FIG. 2, there is shown a section view of a mounted passive cooling apparatus, illustrated generally by numeral 200. The cabinet 110 contains heat generating electronic equipment 210 and may include fans 220 for circulating air within the cabinet. Referring to FIG. 3, there is shown a partial top section view of the mounted cooling apparatus, illustrated generally by numeral 300.

Referring to FIGS. 1, 2, and 3, the passive cooling apparatus 130 consists of a flat vertical metal shield panel 131 and at least two flat vertical metal spacer panels 132. The shield panel 131 has an inner surface 133 and an outer surface 134. Each spacer panel 132 has an apparatus end 135 and a cabinet end 136. The apparatus end 135 of each spacer panel 132 is attached to the inner surface 133 of the shield panel 131 such that each spacer panel 132 and the inner surface 131 are essentially perpendicular. Thus, the shield panel 131 and spacer panels 132 form at least one vertical essentially C-shaped channel.

To mount the passive cooling apparatus 130 on the outdoor electronic equipment cabinet 110, screws 310, washers 320, and thermal pads 330 are used to attach the cabinet ends 136 of at least two spacer panels 132 to a vertical outer surface 111 of the cabinet 110. The thermal pads 330 function to facilitate conduction of heat from the cabinet 110 to the cabinet ends 136 of the spacer panels 132 of the passive cooling apparatus 130. These thermal pads 330 are positioned at points of attachment between the cabinet ends 136 of the spacer panels 132 and the vertical outer surface 111 of the cabinet 110. When mounted, the spacer panels 132, the inner surface 133 of the shield panel 131, and the vertical outer surface 111 of the cabinet 110 define at least one vertical duct 340 or "chimney". Each duct 340 has a bottom opening 230 and a top opening 240.

The shield panel 131 and spacer panels 132 of the passive cooling apparatus 130 are sized and shaped to fit the outer surface 111 of the cabinet 110 to which they are to be attached. The shield panel 131 and spacer panels 132 may be formed or stamped from a single metal plate or sheet. The shield panel 131 and spacer panels 132 may be constructed from a suitable material other than metal.

When mounted on a cabinet 110, the passive cooling apparatus 130 functions to cool the cabinet as follows. Heat generated by the electronics 210 within the cabinet 110 is transferred to the air within the cabinet 110. The air thus warmed circulates (arrow 250) within the cabinet 110. This circulation (arrow 250) may be assisted by fans 220 within the cabinet. Heat from the circulating air is transferred (arrow 350) to an inner vertical surface 112 of the cabinet by convection. This heat is transferred to an outer vertical surface 111 of the cabinet by conduction where it warms air in the duct 340 by convection (arrow 360). Thus warmed, the air in the duct 340 rises (arrow 260) and escapes (arrow 270) through the top opening 240 of the duct 340, drawing (arrow 280) fresh cool air through the bottom opening 230. The outer surface 111 of the cabinet 110 is thus cooled and consequently heat generated by the electronics 210 is extracted from the cabinet 110.

In addition, solar radiation 370 warms the outer surface 134 of the shield panel 131 of the passive cooling apparatus 130. The shield panel 131 thus prevents the solar radiation 370 from reaching the outer surface 111 of the cabinet 110 and hence provides a cooling effect for the cabinet 110. Heat from the solar radiation 370 is dissipated by thermal radiation 380 from the outer surface 134 of the shield panel 131. Similarly, heat generated by the electronics 210 within the cabinet 110, which is conducted through the thermal pads 330 and the spacer panels 132 to the shield panel 131, is dissipated by the thermal radiation 380 from the outer surface 134 of the shield panel 131. Moreover, heat from the solar radiation 370 and from the electronics 210 within the cabinet 110 that has been transferred to the passive cooling apparatus 130 also warms air in the duct 340 by convection (arrow 390). As described above, the air in the duct 340 thus warmed rises (arrow 260) and escapes (arrow 270) through the top opening 240 of the duct 340, drawing (arrow 280) fresh, cool air through the bottom opening 230. The passive cooling apparatus 130 thus provides passive cooling to the cabinet 110.

While the embodiment above was described with reference to a passive cooling apparatus being applied to a vertical surface of the cabinet, a person skilled in the art will appreciate that the surface does not have to be exactly vertical. While it is preferred that the duct 340 created by mounting the passive cooling apparatus to the cabinet is vertical, as long as the top opening 240 is located at a position higher than the bottom opening 230, the desired chimney effect will be achieved. Thus, for example, the passive cooling apparatus may be applied to a surface that is 45 degrees from a vertical position. Other positions will become apparent to the person skilled in the art.

Furthermore, while the above-embodiment was described with reference to essentially C-shaped channels, a person skilled in the art will appreciate that other shaped channels are applicable. For example, the channels may form the shape of a triangle, with the base of the triangles being attached to the outer surface 111 of the cabinet 110. Again, other shaped channels will become apparent to a person skilled in the art.

Although the invention has been described with reference to certain specific embodiments, various modifications thereof will be apparent to those skilled in the art without departing from the spirit and scope of the invention as outlined in the claims appended hereto.

What is claimed is:

1. A passive cooling apparatus for attachment to an exterior surface of a cabinet that houses electronics, said cabinet for protecting said electronics from external elements, said passive cooling apparatus comprising:

an exterior surface for exposure to said external elements; and a coupling that attaches said exterior surface of said passive cooling apparatus to the exterior surface of said cabinet, wherein when said passive cooling apparatus is attached to said exterior surface of said cabinet, said exterior surface of said passive cooling apparatus is maintained in a spaced-apart relationship from said cabinet, forming an enclosed channel having a pair of openings, one of said openings being located above another.

2. A passive cooling apparatus as defined in claim 1, wherein said exterior surface of said passive cooling apparatus comprises a flat first surface and said coupling comprises a plurality of flat coupling surfaces, wherein said plurality of flat coupling surfaces are attached to said flat first surface in a perpendicular relationship, said plurality of flat coupling surfaces for coupling to said exterior surface of said cabinet in a perpendicular relationship, thereby forming said enclosed channel.

3. A passive cooling apparatus as defined in claim 1, wherein when said passive cooling apparatus is coupled to said cabinet, air flows in to a lower one of said openings in said enclosed channel and exits out of a higher one of said openings in said enclosed channel, thereby cooling said exterior surface of said cabinet by convection.

4. A passive cooling apparatus as defined in claim 1, wherein said exterior surface of said passive cooling apparatus and said coupling comprise a thermally conductive material that conducts heat away from said exterior surface of said cabinet when coupled to said cabinet.

5. A passive cooling apparatus as defined in claim 1, wherein said exterior surface of said passive cooling apparatus is configured to intercept sunlight and to radiate heat generated therefrom, thereby providing cooling to said cabinet.

\* \* \* \* \*